United States Patent
Heymann

(10) Patent No.: US 6,611,175 B2
(45) Date of Patent: Aug. 26, 2003

(54) FREQUENCY SYNTHESIZER AND METHOD OF PROVIDING A MIXING OSCILLATOR SIGNAL TO A MIXER

(75) Inventor: Roland Heymann, Sauerlach (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/962,409

(22) Filed: Sep. 24, 2001

(65) Prior Publication Data

US 2002/0033736 A1 Mar. 21, 2002

Related U.S. Application Data

(63) Continuation of application No. PCT/DE00/00873, filed on Mar. 21, 2000.

(30) Foreign Application Priority Data

Mar. 23, 1999 (DE) .......................... 199 13 110

(51) Int. Cl.[7] .................................. H03L 7/00
(52) U.S. Cl. .................. 331/2; 331/1 A; 331/25; 327/105; 455/260; 455/313; 455/323
(58) Field of Search .................... 331/2, 1 A, 25, 331/175; 455/260, 313, 323; 327/105

(56) References Cited

U.S. PATENT DOCUMENTS 4,180,783 A   12/1979  Khalifa ........................... 331/2
5,479,458 A   12/1995  Tanaka ........................ 375/376

FOREIGN PATENT DOCUMENTS

| DE | 43 29 353 A 1 | 3/1995 |
| EP | 0 585 050 A2 | 3/1994 |
| WO | WO 98/42076 | 9/1998 |

OTHER PUBLICATIONS

Ronald C. Stirling: "Frequency Synthesizers for Telemetry Receivers", Microwave Journal, Jul. 1990, pp. 99, 102–104.
International Search Report for PCT/DE00/00873, issued by the European Patent Office on Aug. 9, 2000.

*Primary Examiner*—Arnold Kinkead
(74) *Attorney, Agent, or Firm*—Laurence A. Greenberg; Werner H. Stemer; Ralph E. Locher

(57) ABSTRACT

A frequency synthesizer for generating an oscillator signal with a desired frequency includes a first phase locked loop and a second phase locked loop, which is connected in a cascaded manner to the first phase locked loop, such that the second phase locked loop receives, as a reference frequency, a frequency generated by the first phase locked loop. The second phase locked loop outputs the desired oscillator signal at the output of a divider provided in the feedback path of the second phase locked loop. A method of supplying a mixing oscillator signal to a mixer is also provided.

14 Claims, 7 Drawing Sheets

FIG 4

| $\frac{FVCO1}{Fin}$ | 0.5 | 0.66 | 0.75 | 1 | 1 | 1 | 1.33 | 1.5 | 2 | second PLL | |
|---|---|---|---|---|---|---|---|---|---|---|---|
| | | | | | | | | | | $\frac{R2}{N2}$ R-divider N-divider | |
| | $\frac{2}{4}$ | $\frac{2}{3}$ | $\frac{3}{4}$ | $\frac{2}{2}$ | $\frac{3}{3}$ | $\frac{4}{4}$ | $\frac{4}{3}$ | $\frac{3}{2}$ | $\frac{4}{2}$ | | 1:2.3 Tuning range |
| | possible VCO1 frequencies without band division | | | | | | | | | | |
| FVCO1min FVCO1max | 475 1075 | 633.33 1433 | 712.50 1612.50 | 950 2150 | 950 2150 | 950 2150 | 1266 2866 | 1425 3225 | 1900 4300 | MHz | $FVCO1 = \frac{R2}{N2} \times Fin$ |
| Finmin Finmax | 950 2150 | 950 2150 | 950 2150 | 950 2150 | 950 2150 | 950 2150 | 950 2150 | 950 2150 | 950 2150 | MHz | without band division |
| | possibilities of band division without VCO1 at input frequency | | | | | | | | | | 1:1.51 Tuning range |
| FVCO1min FVCO1max | 712 1076 | <-+-> | 712 1076 | | | | 1900 2870 | <-+-> | 1900 2870 | MHz | $FVCO1 = \frac{R2}{N2} \times Fin$ |
| Finmin Finmax | 1424 2152 | <-+-> | 949 1434 | | | | 1425 2152 | <-+-> | 950 1435 | MHz | band division at 1430 MHz |
| | possibilities of band division with VCO1 at input frequency | | | | | | | | | | 1:1.51 Tuning range |
| FVCO1min FVCO1max | | 950 1434 | <-+-> | 950 1434 | <-> also | 1425 2151 | <-+-> | 1425 2151 | | MHz | $FVCO1 = \frac{R2}{N2} \times Fin$ |
| Finmin Finmax | | 1425 2151 | <-+-> | 950 1434 | possible | 1425 2151 | <-+-> | 950 1434 | | MHz | band division at 1430 MHz |
| | secondary VCO1 | | | VCO1 at Fin | | | primary VCO1 | | | | |

FREQUENCY SYNTHESIZER AND METHOD OF PROVIDING A MIXING OSCILLATOR SIGNAL TO A MIXER

CROSS-REFERENCE TO RELATED APPLICATION

This application is a continuation of copending International Application No. PCT/DE00/00873, filed Mar. 21, 2000, which designated the United States.

BACKGROUND OF THE INVENTION

Field of the Invention

The present invention relates to a frequency synthesizer, in particular a frequency synthesizer for generating mixing oscillator signals for a mixer. The invention also relates to a method of providing a mixing oscillator signal to a mixer, such as an I/Q mixer of a homodyne broadband receiver.

It is known that in digital receiving systems frequency synthesizers are used in the form of mixing oscillators for generating 0°/90° mixing oscillator signals. The 0°/90° mixing oscillator signals are fed to a mixer in order to be mixed there with the high-frequency receive signals of the receiver in order to generate I/Q component signals. In this case, I denotes the signal component which is in phase with the carrier phase, while Q denotes the quadrature component perpendicular to the carrier phase.

In conventional receiving systems, the 0°/90° mixing oscillator signal is generated with the aid of a conventional phase locked loop (PLL), the loop of the phase locked loop essentially having a reference oscillator, a phase detector, a voltage-controlled oscillator and a frequency divider. The phase detector compares the frequency of the reference signal supplied by the reference oscillator with the output frequency of the frequency divider located in the feedback path of the loop, and drives the voltage-controlled oscillator as a function of the result of comparison in order thereby to generate the mixing oscillator signal with the desired frequency.

All known receiver systems operate with a mixing oscillator at the receiving frequency of the receiver. Consequently, it is possible for relatively strong oscillator pulling effects which cause frequency errors in the mixing oscillator signal to occur in the receiver. A further typical problem of known receiver systems relates to the intrinsic mixing of the mixing oscillator, which is caused by crosstalk at the high-frequency input of the corresponding receiver and entails offset DC voltages which can lead to overdriving of the amplifiers used in the receiver. Moreover, two-channel digital I/Q homodyne receiving systems have a relatively poor signal performance. In known solutions without frequency band division, a large tuning or detuning range of the voltage-controlled oscillator cannot be covered simultaneously with good signal performance. In the case of conventional receiving systems, a division of the frequency band is mostly not provided or—if it is—only by using a plurality of oscillators. The exclusively used analog methods for generating the 0°/90° mixing oscillator signals required for I/Q receiving systems do not offer the accuracy and stability of digital methods, and so an increased sensitivity to manufacturing tolerances is to be expected, and this results in turn in increased testing costs.

Published European Patent Application No. EP-A2-0 585 050 discloses a frequency synthesizer with reduced jitter; it includes a first phase locked loop downstream of whose VCO (voltage controlled oscillator) a second phase locked loop is connected in cascaded fashion on the output side. The output signal of the VCO of the second phase locked loop on the one hand forms the output signal of the frequency synthesizer, and on the other hand is fed back to the phase detectors of the first and second phase locked loops via respective dividers. Published, Non-Prosecuted German Patent Application No. DE-A1-43 29 353 discloses a further PLL (phase locked loop) system with cascaded phase locked loops. The output signal is tapped at the output of the VCO of the second phase locked loop.

SUMMARY OF THE INVENTION

It is accordingly an object of the invention to provide a frequency synthesizer which overcomes the above-mentioned disadvantages of the heretofore-known frequency synthesizers of this general type and which permits a wide high-frequency tuning range of the voltage-controlled oscillator used therein with the aid of relatively simple circuit devices. In particular, the frequency synthesizer is to be suitable for use as a mixing oscillator in a digital homodyne receiving system, wherein the problems described above and associated with conventional mixing oscillator solutions such as, for example, oscillator pulling or intrinsic mixing, are eliminated.

With the foregoing and other objects in view there is provided, in accordance with the invention, a frequency synthesizer for generating an oscillator signal of a desired frequency, including:

a first phase locked loop for generating a signal with a given frequency from a reference frequency signal;

a second phase locked loop connected in a cascaded manner to the first phase locked loop such that the second phase locked loop receives the given frequency of the signal generated by the first phase locked loop as a reference frequency;

the first phase locked loop having a reference voltage source for generating the reference frequency signal, a first phase detector, a first voltage-controlled oscillator and a first frequency divider;

the first phase detector comparing a frequency of the reference frequency signal with a frequency supplied by the first frequency divider and, as a function thereof, driving the first voltage-controlled oscillator;

the second phase locked loop having a second phase detector, a second voltage-controlled oscillator, a second frequency divider, a fourth frequency divider, and a fifth frequency divider;

the second phase detector comparing a frequency, supplied by the first voltage-controlled oscillator of the first phase locked loop, with a frequency supplied by the second frequency divider and, as a function thereof, driving the second voltage-controlled oscillator;

the second frequency divider of the second phase locked loop and the first frequency divider of the first phase locked loop receiving a signal dependent on an output signal from the second voltage-controlled oscillator;

the second phase detector of the second phase locked loop receiving, via the fourth frequency divider, the frequency supplied by the first voltage-controlled oscillator;

the second frequency divider of the second phase locked loop and the first frequency divider of the first phase locked loop receiving, via the fifth frequency divider, the frequency supplied by the second voltage-controlled oscillator of the second phase locked loop; and the fifth frequency divider providing, as an output signal, the oscillator signal with the desired frequency.

According to the invention, a first phase locked loop is expanded by a further phase locked loop, which is connected to the known phase locked loop in cascaded fashion such that the second phase locked loop is provided in the feedback loop of the first phase locked loop between the voltage-controlled oscillator thereof and the frequency divider thereof. Thus two mutually nested phase locked loops are provided.

In this way, the voltage-controlled oscillator of the first phase locked loop of the frequency synthesizer can be set to frequencies deviating from the receive frequency of the corresponding receiver, and therefore operates at a frequency offset with reference to the receive frequency, in order to avoid oscillator pulling effects and intrinsic mixing effects. The other oscillators of the frequency synthesizer also do not oscillate at the receive frequency.

The second phase locked loop preferably operates at four times the receive frequency, such that a digital generation of the 0°/90° mixing oscillator signal is rendered possible for digital receiving systems with exceptionally high accuracy (deviation<1°) and independently of manufacturing tolerances, since the 0°/90° mixing oscillator signal can, for example, be generated by a high-precision Johnson counter which, with the exception of the built-in matching, is subject to hardly any further manufacturing tolerances.

The present invention offers the possibility of dividing the receiving range into bands without the attendant need of a plurality of oscillators, such that it is possible to implement a frequency synthesizer with a wide tuning range and with a high quality factor in conjunction with a small variation in the phase noise, which constitutes a decisive operating parameter for the system performance in the case of digital systems.

It is particularly advantageous when the frequency synthesizer is configured to be programmable, something which promotes flexibility and thus customer friendliness. Although the voltage-controlled oscillator of the first phase locked loop does not oscillate at the receive frequency, it is nevertheless the receive frequency, that is to say the oscillator frequency of the mixer of the receiver, that is chosen as reference frequency for the first phase locked loop, and so the phase locked loop can be programmed more simply since it is set precisely to the tuning frequencies. A further great advantage is that the step width of the phase locked loop is retained with reference to the receive frequency.

The above-described advantages of the invention would not be possible in the case of the known frequency synthesizers which are based on the conventional PLL tuning principle described at the beginning, with the precondition that the voltage-controlled oscillator is not to operate at the receive frequency.

According to another feature of the invention, a third frequency divider is provided, and the reference voltage source supplies, via the third frequency divider, the reference frequency signal to the first phase detector of the first phase locked loop.

According to another feature of the invention, the first, second, third, fourth, and fifth frequency dividers are respectively implemented by counters.

According to yet another feature of the invention, the reference voltage source and the third frequency divider are configured such that a reference frequency of the reference voltage source and a divider ratio of the third frequency divider of the first phase locked loop are selected as a function of the desired frequency of the oscillator signal such that the first phase detector of the first phase locked loop receives, as a reference frequency, a desired step width of the oscillator signal.

According to a further feature of the invention, the first, second, third, fourth and fifth frequency dividers have respective divider ratios, and the first, second, third, fourth and fifth frequency dividers and the reference voltage source are configured such that the divider ratios of the first, second, third, fourth and fifth frequency dividers and a reference frequency of the reference voltage source are selected such that the second voltage-controlled oscillator of the second phase locked loop receives a frequency corresponding to four times a value of the desired frequency of the oscillator signal, and such that the fifth frequency divider has a divider ratio of 1:4.

According to another feature of the invention, the fifth frequency divider is implemented as a Johnson counter, and the Johnson counter outputs two oscillator signals mutually offset in phase by 90°.

According to yet another feature of the invention, the first, second, third, and fourth frequency dividers have respective programmable divider ratios.

According to another feature of the invention, the second phase locked loop has two second voltage-controlled oscillators with respectively different frequency ranges, the second phase locked loop being configured to switch between the two second voltage-controlled oscillators as a function of the desired frequency of the oscillator signal.

According to a further feature of the invention, the second frequency divider and the fourth frequency divider of the second phase locked loop are in each case formed by a combination of a divider with a fixed divider ratio and a divider with a programmable divider ratio.

With the objects of the invention in view there is also provided, a method of providing a mixing oscillator signal to a mixer, the method includes the steps of:

providing a mixing oscillator including a first phase locked loop for generating a signal with a given frequency from a reference frequency signal and including a second phase locked loop connected in a cascaded manner to the first phase locked loop such that the second phase locked loop receives the given frequency of the signal generated by the first phase locked loop as a reference frequency, the first phase locked loop having a reference voltage source for generating the reference frequency signal, a first phase detector, a first voltage-controlled oscillator and a first frequency divider, the first phase detector comparing a frequency of the reference frequency signal with a frequency supplied by the first frequency divider and, as a function thereof, driving the first voltage-controlled oscillator, the second phase locked loop having a second phase detector, a second voltage-controlled oscillator, a second frequency divider, a fourth frequency divider, and a fifth frequency divider, the second phase detector comparing a frequency, supplied by the first voltage-controlled oscillator of the first phase locked loop, with a frequency supplied by the second frequency divider and, as a function thereof, driving the second voltage-controlled oscillator, the second frequency divider of the second phase locked loop and the first frequency divider of the first phase locked loop receiving a signal dependent on an output signal from the second voltage-controlled oscillator, the second phase detector of the second phase locked loop receiving, via the fourth frequency divider, the frequency supplied by the first voltage-controlled oscillator, the second frequency divider of the second phase locked loop and the first frequency divider of the first phase locked loop receiving, via the fifth frequency divider, the frequency supplied by the second voltage-controlled oscillator of the second phase locked loop, and the fifth frequency divider providing, as an output signal, the mixing oscillator signal with a desired frequency; and providing the mixing oscillator signal with the desired frequency to the mixer.

According to another mode of the invention, the mixing oscillator is used in a homodyne receiver, and the mixer mixes the mixing oscillator signal supplied by the mixing oscillator with a received signal of the homodyne receiver.

According to another mode of the invention, the mixer is an I/Q mixer, the mixing oscillator feeds oscillator signals mutually offset in phase by 90° to the I/Q mixer, and the I/Q mixer mixes the mixing oscillator signals with received signals of a digital homodyne receiver, such that the I/Q mixer outputs an I component signal and a Q component signal.

The invention is explained below with reference to the drawings based on preferred exemplary embodiments which relate to the preferred use of the present invention as mixing oscillator, in particular as 0°/90° mixing oscillator, in a homodyne receiver. It is pointed out that the invention is not limited to this field of use, but can in principle be used as desired in any analog or digital system where there is a need for a high-precision frequency synthesizer with a wide tuning range.

Other features which are considered as characteristic for the invention are set forth in the appended claims.

Although the invention is illustrated and described herein as embodied in a frequency synthesizer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a table for explaining tuning ranges, which can be programmed in the case of the exemplary embodiments shown in FIG. 1 and FIG. 2, of the voltage-controlled oscillator of the first phase locked loop.

DESCRIPTION OF THE PREFERRED EMBODIMENTS

Figure 1:
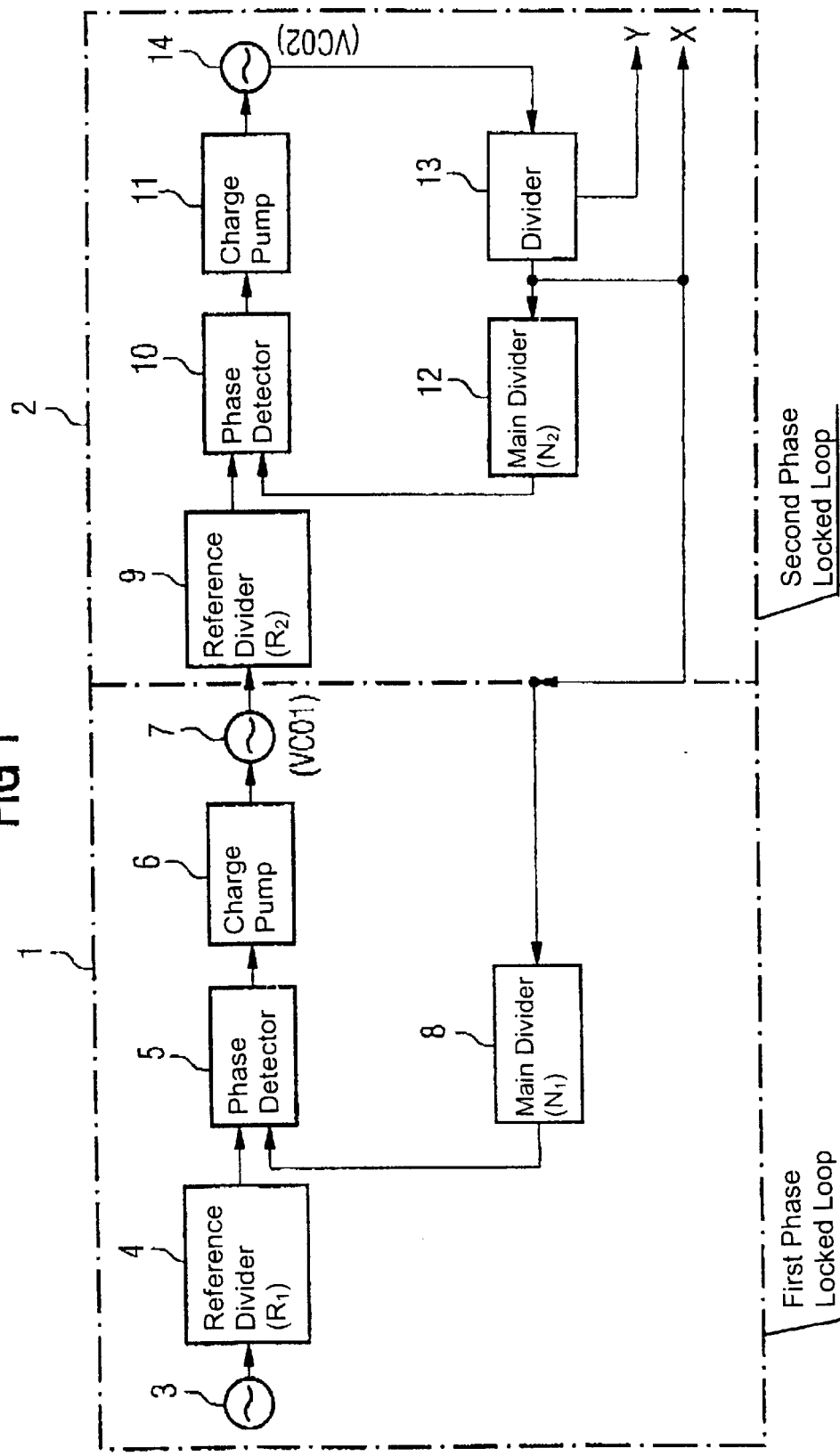
FIG. 1 is a simplified block diagram of a first exemplary embodiment of the invention.

Referring now to the figures of the drawings in detail and first, particularly, to FIG. 1 thereof, there is shown an exemplary embodiment of the invention which essentially includes two interleaved phase locked loops (PLL) 1 and 2, that is to say the first phase locked loop 1 normally used in tuning systems has been expanded by the second phase locked loop 2, which is interleaved therewith in cascaded fashion.

The first phase locked loop 1 includes a reference oscillator 1, a reference divider 4 for dividing the frequency, supplied by the reference oscillator, with a divider ratio of $1:R_1$, a phase detector 5, a charge pump 6, connected in series therewith, a voltage-controlled oscillator (VCO1) and a further frequency divider 8, which is provided in the feedback path of the phase locked loop, is denoted as main divider and has the divider ratio of $1:N_1$. The phase detector 5 compares the frequencies of the reference divider 4 which are fed to it and of the main divider 8, and generates an actuating signal as a function of the result of comparison in order to correct the output frequency of the voltage-controlled oscillator 7 via the charge pump 6.

Usually, the feedback path between the output of the oscillator 7 and the main divider 8 is closed. By contrast, according to the invention the second phase locked loop 2 is provided in the feedback path of the first phase locked loop 1, which is interrupted at this point. The second phase locked loop 2 also includes a reference divider 9 with the divider ratio of $1:R_2$, a phase detector 10, a charge pump 11, a voltage controlled oscillator (VCO2) 14 and a further frequency divider or main divider 12 with the divider ratio of $1:N_2$, which is provided in a way known per se in the feedback path of the second phase locked loop 2. The phase detector 10 compares the frequency supplied by the main divider 12 with the frequency supplied by the reference divider 9 and, as a function thereof, drives the oscillator 14 via the charge pump 11 in order to correct the output frequency of the oscillator in accordance with the result of comparison of the phase detector 10. The cascade-type nesting of the two phase locked loops is therefore such that the reference divider 9 of the second phase locked loop 2 is fed as reference signal the output signal of the voltage-controlled oscillator 7 of the first phase locked loop 1, and the main divider 8 of the first phase locked loop 1 is fed a signal dependent on the output signal supplied by the voltage-controlled oscillator 14 of the second phase locked loop 2. This configuration permits the voltage controlled oscillator 7 to be shifted to other frequencies independently of the required mixing oscillator frequency for the high-frequency input mixer of the homodyne receiver to be operated thereby. That is to say, the oscillator 7 must not oscillate at the required mixing oscillator frequency supplied by the second phase locked loop 2.

Nevertheless, the first phase locked loop is preferably referenced to the targeted mixing oscillator frequency, that is to say the phase detector 5 is fed the desired mixing oscillator frequency by the reference divider 4 such that the phase locked loops 1 and 2 can be programmed easily as a function of the mixing oscillator frequency. A further great advantage is that the step width of the overall phase locked loop formed thereby is retained with reference to the receive frequency corresponding to the mixing oscillator frequency.

The above-described advantages are not possible in the case of a conventional PLL tuning system with feedback of the output signal of the oscillator 7 directly to the main divider 8, when the oscillator 7 is not to oscillate at the receive frequency, since in this case upon closure of the feedback between the oscillator 7 and the main divider 8 the receive step widths and tuning frequencies are calculated by additional formulae and no longer correspond to the programmed values of the phase locked loop 1, which are then referenced to the oscillator 7.

The reference dividers 4 and 9 shown in FIG. 1 and charge pumps 6 and 11 admittedly are not elements essential to the invention, but they enhance the flexibility and signal performance of the circuit.

The two programmable frequency dividers 9 and 12 permit a programmable frequency offset of the voltage-controlled oscillator 7 with reference to the high-frequency input of the corresponding receiving system with simultaneous division of the required high-frequency tuning range.

Advantageously connected in addition in the feedback path of the second phase locked loop 2 between the oscillator 14 and the main divider 12 is a further frequency divider 13, which is also denoted as a prescaler or predivider. The desired mixing oscillator signal x is tapped between the prescaler 13 and the main divider 12 and fed to the appropriate mixer. The prescaler 13 ensures that the voltage-controlled oscillator 14 (VCO2) of the second phase locked loop 2 also need not oscillate at the receive frequency, that is to say none of the oscillators 3, 7 and 14 used oscillates at the receive frequency, so that undesired side effects, such as oscillator pulling in particular, occurring with the prior art described at the beginning can be avoided.

Digital receiving systems require the generation of 0°/90° mixing oscillator signals, that is to say mixing oscillator signals mutually offset in phase by 90°, which are fed for the purpose of obtaining the I or Q component signal to an I/Q mixer which mixes the high-frequency received signals with the 0°/90° mixing oscillator signals.

For this purpose, the second phase locked loop or the voltage-controlled oscillator 14 thereof advantageously operates at four times the receive frequency, and the prescaler 13 is formed by a high-precision Johnson counter with the divider ratio of 1:4 such that 0°/90° mixing oscillator signals x and y can be delivered by the prescaler 13 with high accuracy. In particular, it is ensured in this case that the two 0°/90° mixing oscillator signals x and y have the same mark-to-space ratio, as is necessary for accurate generation of the I or Q component signals in the downstream mixer. The Johnson counter therefore serves in this case firstly as prescaler for the oscillator 14, and secondly as 0°/90° voltage generator.

Figure 3:
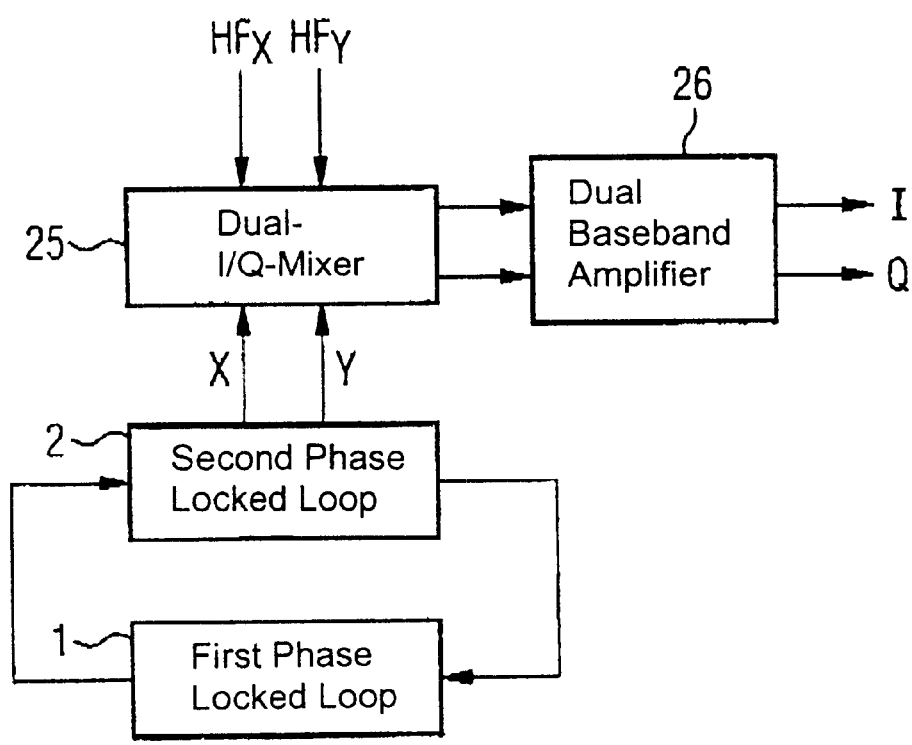
FIG. 3 is a block diagram for illustrating the connection of a frequency synthesizer according to the invention to an I/Q mixer in a homodyne receiving system.

FIG. 3 illustrates the already previously indicated connection of the frequency synthesizer according to the invention having the two phase locked loops 1 and 2, nested in cascaded fashion, to a dual I/Q mixer 25 of a digital homodyne receiver. The mixer 25 is fed the 0°/90° mixing oscillator signals x, y by the prescaler 13 or Johnson counter shown in FIG. 1. Moreover, the mixer 25 receives the high-frequency received signals HFx and HFy of the receiving system, which are present with a specific receive frequency to which the frequency synthesizer according to the invention has been tuned by appropriate programming, in order to generate the mixing oscillator signals x and y present with the same frequency. The mixer 25 mixes the received signals HFx and HFy with the mixing oscillator signals x and y, respectively, and feeds the signals resulting therefrom to a dual baseband amplifier 26, which thereupon outputs the desired I and Q component signals.

Figure 2:
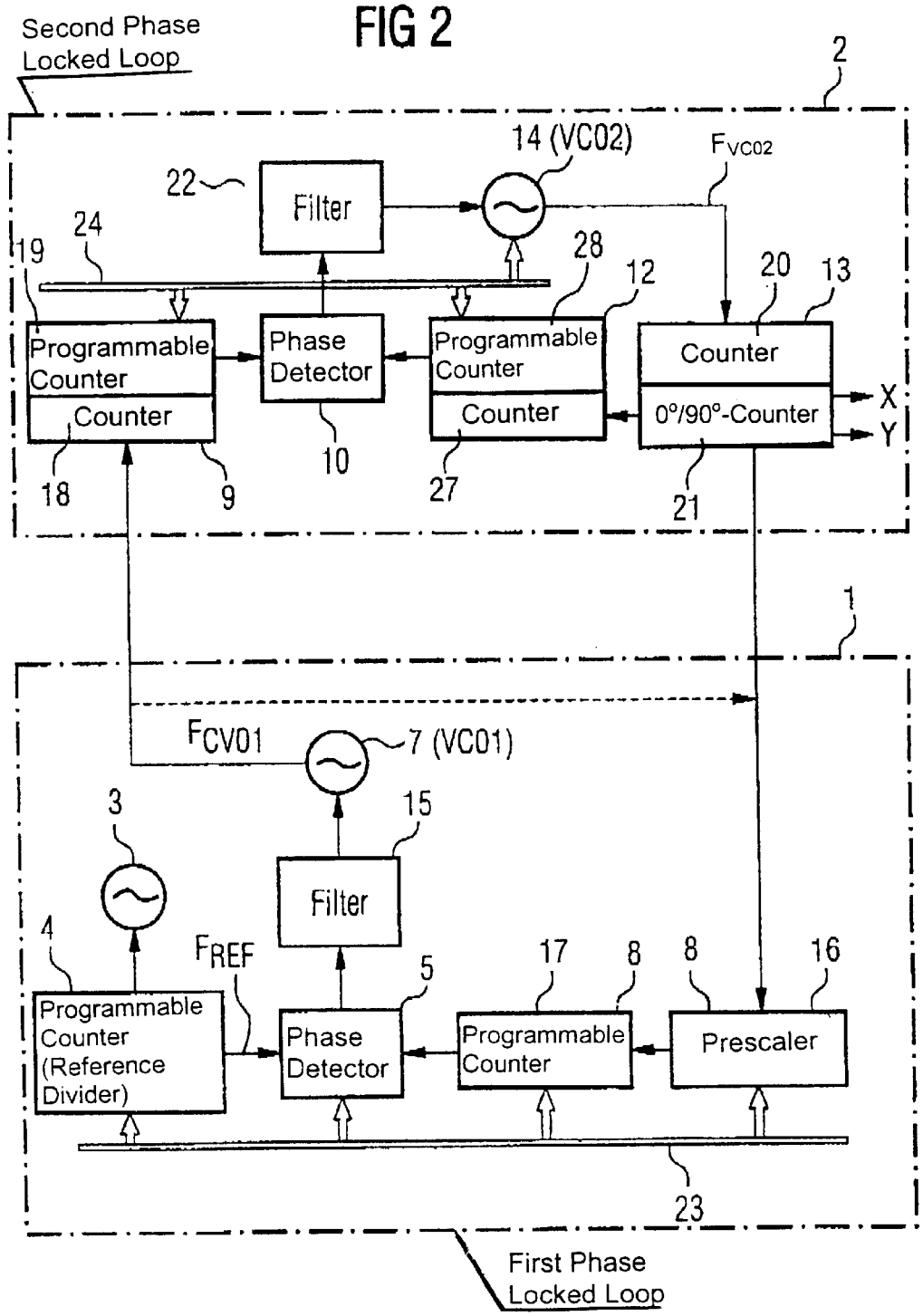
FIG. 2 is a simplified block diagram of a second exemplary embodiment of the invention.

A further exemplary embodiment of the present invention is illustrated in FIG. 2, the corresponding components being provided with the same reference symbols. In accordance with FIG. 2, low-pass filters 15 and 22, respectively, are provided in the phase locked loops 1 and 2 instead of the charge pumps shown in FIG. 1. The exemplary embodiment shown in FIG. 2 relates, in particular, to a frequency synthesizer or mixing oscillator for a digital satellite receiving system with a receive frequency range of approximately 950–2150 MHz.

The cascade-type nesting of the second phase locked loop 2, which serves, as previously described, as quadrature phase generator and is provided in order to implement the frequency band division of the frequency offset, with the first phase locked loop 1 is also to be seen from the illustration of FIG. 2.

The reference oscillator 3 of the first phase locked loop 1 has in this example a frequency range of 1–16 MHz, and the reference divider 5 is configured in the form of a programmable counter with the divider factor of R1=2–1023, such that step widths of 16 kHz–2 MHz are set at the phase detector 5 as reference frequency $F_{REF}$. The main divider 8 shown in FIG. 1 of the first phase locked loop 1 is formed in the case of the exemplary embodiment shown in FIG. 2 by the combination of a modulus prescaler 16 with a programmable counter 17. The modulus prescaler 16 switches over between two different frequencies such that, in combination with the counter 17, which implements the divider factor of $N_1$=2–2023, a linear division of the frequency fed from the second phase locked loop 2 is possible. The filter 15 preferably has the cutoff frequency of $f_c$=2 kHz. The frequency range of the voltage-controlled oscillator 7 (VCO1) may be seen, as a function of the respectively chosen VCO range, in FIG. 4, which is discussed further below, and is 1.9–2.9 GHz, for example.

The short circuit between the output of the oscillator 7 and the input of the prescaler 16 as provided in conventional PLL tuning systems is indicated by dashes in FIG. 2.

According to the invention, however, this connection is broken, and the output signal of the oscillator 7 is fed to the reference divider 9 of the second phase locked loop 2. As in the first phase locked loop 1, all the dividers are implemented by (programmable) counters in the second phase locked loop as well. In this exemplary embodiment, the reference divider is formed by the combination of a divider 18 with the fixed divider ratio of 1:2 and a programmable divider 19 with the divider ratio of 1:2, 1:3 or 1:4. The filter 22 of the second phase locked loop has, for example, the cutoff frequency of $f_c$=2 MHz. The main divider 12 of the second phase locked loop 2 is also formed by the combination of a divider 27 with the fixed divider ratio of 1:2 and a programmable divider 28 with the divider ratio of 1:2, 1:3 or 1:4. The prescaler 13 is formed, in a way analogous to FIG. 1, by a Johnson counter with the fixed divider ratio of 1:4. The Johnson counter includes the combination of a counter 20 with the divider ratio of 1:2 and a 0°/90° counter 21, which likewise implements the divider ratio of 1:2 and provides the 0°/90° mixing oscillator signals x, y. Since the Johnson counter or prescaler 13 has the fixed divider ratio of 1:4, use is made in the exemplary embodiment shown in FIG. 2 of two voltage-controlled oscillators (VCO2) 14, in order to be able to cover the entire receive frequency range, the frequency range of one oscillator covering $F_{VCO2}$= 3.4–6.2 GHz and the frequency range of the other oscillator covering $F_{VCO2}$=6.0–8.6 GHz. If the prescaler 13 is of programmable configuration, only one voltage-controlled oscillator 14 is required. The frequency of the 0°/90° mixing oscillator signals x, y corresponds to the value $F_{VCO1}*N_2/R_2$, $N_2$ denoting the divider factor of the main divider 12, and $R_2$ denoting the divider factor of the reference divider 9.

The programmable components of the first and second phase locked loops 1 and 2 are programmed via programming lines 23 and 24 which can be driven via an appropriate programming interface. As a result of suitable programming of the phase locked loops 1 and 2, the 0°/90° mixing oscillator signals x, y supplied by the Johnson counter 13 cover the frequency range of 950–2150 MHz corresponding to the receive frequency range. Moreover, the programming line 24 can be used to switch over between the two previously mentioned oscillators 14 of the second phase locked loop 2 as a function of the receive frequency.

Illustrated in FIG. 4 is a table for explaining programmable tuning ranges, in the case of the exemplary embodiments shown in FIG. 1 and FIG. 2, of the voltage-controlled oscillator 7 of the first phase locked loop 1. The table shows the possible frequencies of the oscillator 7 as a function of the ratio to the receive frequency $F_{in}$, that is to say as a function of the quotient $F_{VCO1}/F_{in}$, and the divider ratio $R_2/N_2$. The frequency $F_{VCO1}$ of the oscillator 7 is always set as a function of the receive frequency $F_{in}$ and the expression $R_2/N_2$ in such a way that it holds that: $F_{VCO1}=F_{in}*R_2/N_2$. Illustrated in particular in FIG. 4 are the values for the tuning ranges of 1:2.3 without division of the frequency band, and 1:1.51 with frequency band division at 1430 MHz for the receive frequency range of 950–2151 MHz. The case in which the oscillator 7 (VCO1) oscillates at the receive frequency $F_{in}$ is certainly also possible in principle, but should be circumvented in order to avoid oscillator pulling.

In the case of an extremely broadband receiving range as with homodyne receivers, the receiving range is divided as described above into a plurality of bands. If a single VCO is used for tuning, the double PLL system is operated in the way described below. Directly juxtaposed frequency bands are generated for the local oscillator frequency through the use of different divider ratios $R_2/N_2$. The oscillator 7 serving the purpose of tuning traverses its detuning range several times. The receiving range is divided into n portions for n different divider ratios $R_2/N_2$, for example. Their size need not be the same, but it is a function of the various mutually adjacent divider ratios $R_2/N_2$ and of the possible detuning range of the oscillator 7. The oscillator 7 traverses its detuning range n times in the process. As with a conventional tuning system with a single PLL, in this case the dividers 4, 8 and their divider ratios $R_1/N_1$ serve the purpose of linear programming of the local oscillator frequencies, which can be tapped on the output side at the I/Q divider 13. For homodyne receivers, these are on the input frequency.

In order to avoid the risk of oscillator pulling effects, the frequencies of the oscillator 7 serving the purpose of tuning may not be in the vicinity of the input frequency. For this purpose, the divider ratio $R_2/N_2$ is chosen to be sufficiently far from one so that the oscillator 7 either is always situated outside the receiving range, or at least so far away that adjacent input frequencies, which are equal to the frequency of the oscillator 7, can be adequately suppressed. In the former case, an input filter with a fixed transmission characteristic is suitable, while in the latter case an input filter with a variable passband is suitable.

Figure 5:
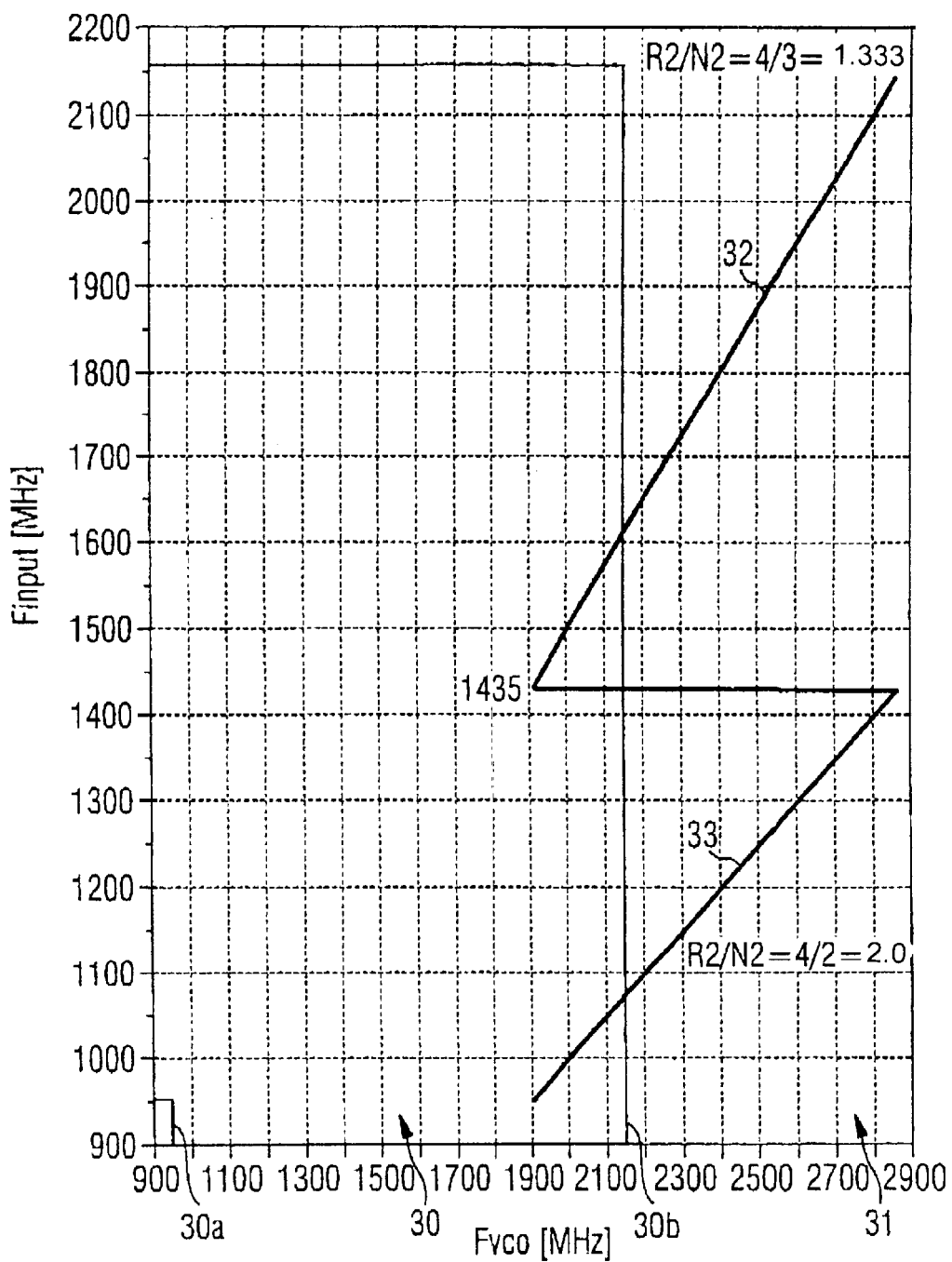
FIGS. 5, 6 and 7 are diagrams of a receive frequency and a frequency of the VCO of the first phase locked loop for various ratios of $R_2/N_2$.
Figure 6:
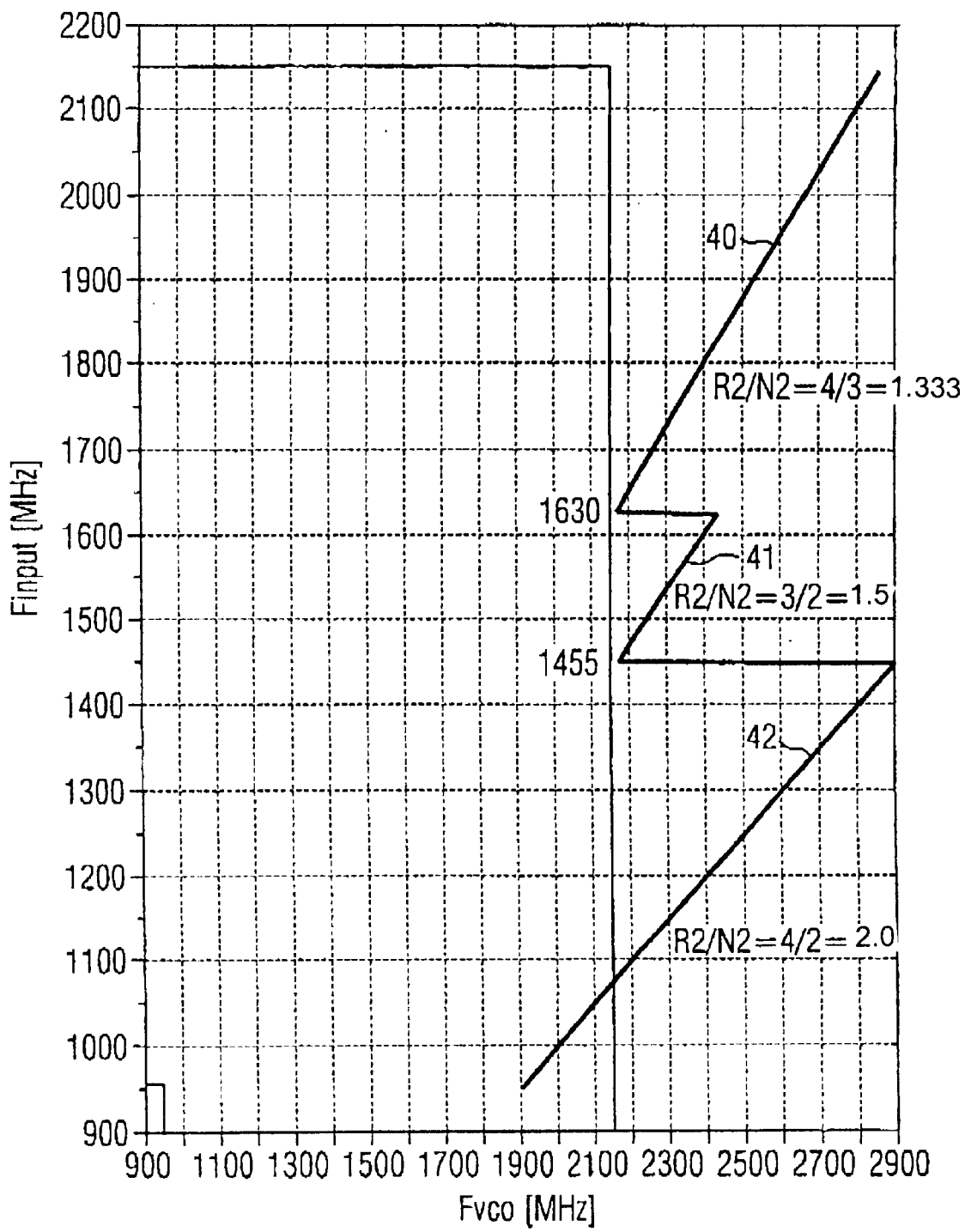
Figure 7:
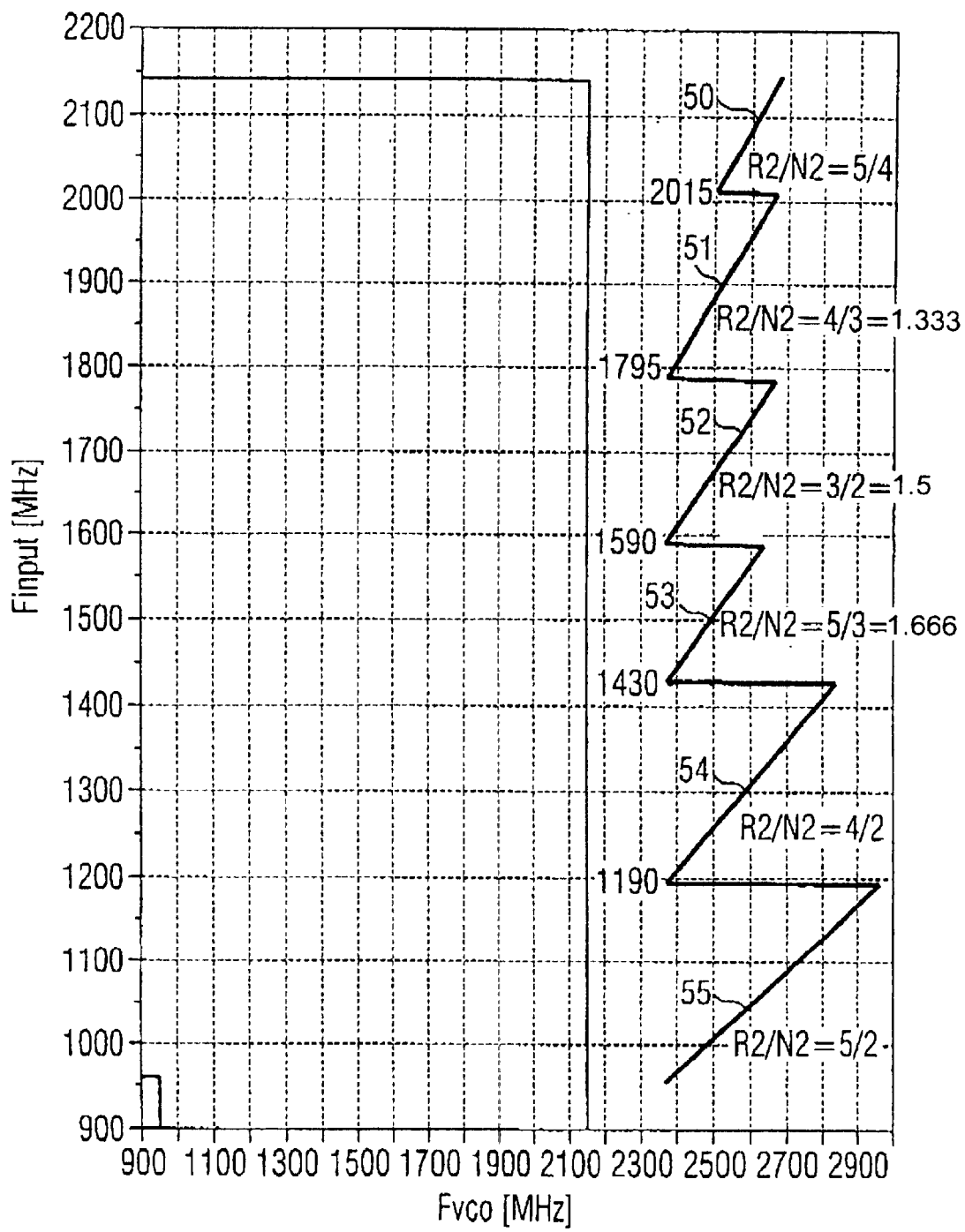

The diagrams illustrated in FIGS. 5 to 7 show the position of the frequencies of the oscillator 7 relative to the input frequency for the synthesizer circuits described in FIGS. 1 and 2, respectively. The receive frequency range 30 is marked in FIG. 5 by the lines 30a and 30b. The frequency range 31 is situated outside the receive frequency range. The lines 32, 33 show the tuning frequencies of the oscillator 7 in the case of a variable tuning range, that is to say a variable divider ratio $R_1/N_1$. The line 32 shows the frequency profile of the oscillator 7 for a divider ratio of $R_2/N_2=4/3$. The tuning line 33 shows this profile for a divider ratio of $R_2/N_2=4/2$. The lines 32, 33 also intersect the line 30b in the region of their low-frequency segment, that is to say the tuning oscillator 7 oscillates at a few receive frequencies in the receive frequency range for the input signal. The divider ratio $R_2/N_2$ is changed three times in FIG. 6, resulting in three receiving bands 40, 41 and 42. Only in the case of the receiving band 42 are frequencies of the tuning oscillator 7 situated in input frequency range. Six receive frequency ranges 50, . . . , 55 are provided in the case of the exemplary embodiment of FIG. 7, and these are generated by corresponding divider ratios $R_2/N_2$. The frequency of the tuning oscillator 7 is sufficiently far outside the input receiving range.

I claim:
1. A frequency synthesizer for generating an oscillator signal of a desired frequency, comprising:
   a first phase locked loop for generating a signal with a given frequency from a reference frequency signal;
   a second phase locked loop connected in a cascaded manner to said first phase locked loop such that said second phase locked loop receives the given frequency of the signal generated by said first phase locked loop as a reference frequency;
   said first phase locked loop having a reference voltage source for generating the reference frequency signal, a reference frequency divider, a first phase detector, a first voltage-controlled oscillator and a first main frequency divider;
   said first phase detector comparing a frequency of the reference frequency signal with a frequency supplied by said first main frequency divider and, as a function thereof, driving said first voltage-controlled oscillator;
   said second phase locked loop having a second phase detector, a second voltage-controlled oscillator, a second main frequency divider, a further reference frequency divider, and an additional frequency divider;
   said second phase detector comparing a frequency, supplied by said first voltage-controlled oscillator of said first phase locked loop, with a frequency supplied by said second main frequency divider and, as a function thereof, driving said second voltage-controlled oscillator;
   said second main frequency divider of said second phase locked loop and said first main frequency divider of said first phase locked loop receiving a signal dependent on an output signal from said second voltage-controlled oscillator;
   said second phase detector of said second phase locked loop receiving, via said further reference frequency divider, the frequency supplied by said first further voltage-controlled oscillator;
   said second main frequency divider of said second phase locked loop and said first main frequency divider of said first phase locked loop receiving, via said additional frequency divider, the frequency supplied by said second voltage-controlled oscillator of said second phase locked loop;
   said additional frequency divider providing, as an output signal, the oscillator signal with the desired frequency;
   said first main frequency divider, said second main frequency divider, said reference frequency divider, said further reference frequency divider, and said additional frequency divider having respective divider ratios; and
   said first main frequency divider, said second main frequency divider, said reference frequency divider, said further reference frequency divider, said additional frequency divider and said reference voltage source being configured to select the divider ratios of said first main frequency divider, said second main frequency divider, said reference frequency divider, said further reference frequency divider, and said additional frequency divider, and a reference frequency of said reference voltage source to cause said second voltage-controlled oscillator of said second phase locked loop to receive a frequency corresponding to four times a value of the desired frequency of the oscillator signal, and to cause said additional frequency divider to have a divider ratio of 1:4.

2. The frequency synthesizer according to claim 1, wherein said reference voltage source supplies, via said reference frequency divider, the reference frequency signal to said first phase detector of said first phase locked loop.

3. The frequency synthesizer according to claim 1, wherein said first main frequency divider, said second main frequency divider, said reference frequency divider, said further reference frequency divider, and said additional frequency divider are respectively implemented by counters.

4. The frequency synthesizer according to claim 1, wherein said reference voltage source and said reference frequency divider are configured to select a reference frequency of said reference voltage source and a divider ratio of said reference frequency divider of said first phase locked loop as a function of the desired frequency of the oscillator signal to cause said first phase detector of said first phase locked loop to receive, as a reference frequency, a desired step width of the oscillator signal.

5. The frequency synthesizer according to claim 1, wherein:
said additional frequency divider is implemented as a Johnson counter; and
said Johnson counter outputs two oscillator signals mutually offset in phase by 90°.

6. The frequency synthesizer according to claim 1, wherein said first main frequency divider, said second main frequency divider, said reference frequency divider, said further reference frequency divider, and said additional frequency divider have respective programmable divider ratios.

7. A frequency synthesizer for generating an oscillator signal of a desired frequency, comprising:
a first phase locked loop for generating a signal with a given frequency from a reference frequency signal;
a second phase locked loop connected in a cascaded manner to said first phase locked loop to cause said second phase locked loop to receive the given frequency of the signal generated by said first phase locked loop as a reference frequency;
said first phase locked loop having a reference voltage source for generating the reference frequency signal, a reference frequency divider, a first phase detector, a first voltage-controlled oscillator and a first main frequency divider;
said first phase detector comparing a frequency of the reference frequency signal with a frequency supplied by said first main frequency divider and, as a function thereof, driving said first voltage-controlled oscillator;
said second phase locked loop having a second phase detector, a second voltage-controlled oscillator, a second main frequency divider, a further reference frequency divider, and an additional frequency divider;
said second phase detector comparing a frequency, supplied by said first voltage-controlled oscillator of said first phase locked loop, with a frequency supplied by said second main frequency divider and, as a function thereof, driving said second voltage-controlled oscillator;
said second main frequency divider of said second phase locked loop and said first main frequency divider of said first phase locked loop receiving a signal dependent on an output signal from said second voltage-controlled oscillator;

said second phase detector of said second phase locked loop receiving, via said further reference frequency divider, the frequency supplied by said first voltage-controlled oscillator;
said second main frequency divider of said second phase locked loop and said first main frequency divider of said first phase locked loop receiving, via said additional frequency divider, the frequency supplied by said second voltage-controlled oscillator of said second phase locked loop;
said additional frequency divider providing, as an output signal, the oscillator signal with the desired frequency; and
said second phase locked loop having two second voltage-controlled oscillators with respectively different frequency ranges, said second phase locked loop being configured to switch between said two second voltage-controlled oscillators as a function of the desired frequency of the oscillator signal.

8. The frequency synthesizer according to claim 1, wherein said second main frequency divider and said further reference frequency divider of said second phase locked loop are in each case formed by a combination of a divider with a fixed divider ratio and a divider with a programmable divider ratio.

9. A method of providing a mixing oscillator signal to a mixer, the method which comprises:
providing a mixing oscillator including a first phase locked loop for generating a signal with a given frequency from a reference frequency signal and including a second phase locked loop connected in a cascaded manner to the first phase locked loop such that the second phase locked loop receives the given frequency of the signal generated by the first phase locked loop as a reference frequency, the first phase locked loop having a reference voltage source for generating the reference frequency signal, a first phase detector, a first voltage-controlled oscillator and a first main frequency divider, the first phase detector comparing a frequency of the reference frequency signal with a frequency supplied by the first frequency divider and, as a function thereof, driving the first voltage-controlled oscillator, the second phase locked loop having a second phase detector, a second voltage-controlled oscillator, a second main frequency divider, a reference frequency divider, and an additional frequency divider, the second phase detector comparing a frequency, supplied by the first voltage-controlled oscillator of the first phase locked loop, with a frequency supplied by the second main frequency divider and, as a function thereof, driving the second voltage-controlled oscillator, the second main frequency divider of the second phase locked loop and the first main frequency divider of the first phase locked loop receiving a signal dependent on an output signal from the second voltage-controlled oscillator, the second phase detector of the second phase locked loop receiving, via the reference frequency divider, the frequency supplied by the first voltage-controlled oscillator, the second main frequency divider of the second phase locked loop and the first main frequency divider of the first phase locked loop receiving, via the additional frequency divider, the frequency supplied by the second voltage-controlled oscillator of the second phase locked loop, and the additional frequency divider providing, as an output signal, the mixing oscillator signal with a desired frequency; and providing the mixing oscillator signal with the desired frequency to the mixer.

10. The method according to claim 9, which comprises using the mixing oscillator in a homodyne receiver; and mixing, with the mixer, the mixing oscillator signal supplied by the mixing oscillator with a received signal of the homodyne receiver.

11. The method according to claim 9, which comprises:

providing the mixer as an I/Q mixer;

feeding, with the mixing oscillator, mixing oscillator signals mutually offset in phase by 90° to the I/Q mixer; and mixing, with the I/Q mixer, the mixing oscillator signals with received signals of a digital homodyne receiver, such that the I/Q mixer outputs an I component signal and a Q component signal.

12. The frequency synthesizer according to claim 7, wherein said reference voltage source supplying, via said reference frequency divider, the reference frequency signal to said first phase detector of said first phase locked loop.

13. The frequency synthesizer according to claim 7, wherein said first main frequency divider, said second main frequency divider, said reference frequency divider, said further reference frequency divider, and said additional frequency divider are respectively implemented by counters.

14. The frequency synthesizer according to claim 7, wherein said reference voltage source and said reference frequency divider are configured such that a reference frequency of said reference voltage source and a divider ratio of said reference frequency divider of said first phase locked loop are selected as a function of the desired frequency of the oscillator signal such that said first phase detector of said first phase locked loop receives, as a reference frequency, a desired step width of the oscillator signal.

* * * * *